(12) United States Patent
Crippen et al.

(10) Patent No.: US 7,881,052 B2
(45) Date of Patent: Feb. 1, 2011

(54) COMPACT HDD CARRIER MECHANISM FEATURING SELF ACTUATING EMC SPRINGS TO PREVENT HDD COMPONENT SHORTING

(75) Inventors: Martin Joseph Crippen, Apex, NC (US); David George Lund, Byron, MN (US); Charles William Piper, Burlington, NC (US); Brian Alan Trumbo, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 12/333,442

(22) Filed: Dec. 12, 2008

(65) Prior Publication Data

US 2010/0149746 A1 Jun. 17, 2010

(51) Int. Cl.
*H05K 7/00* (2006.01)
*H05K 9/00* (2006.01)
*H05K 7/16* (2006.01)
*A47B 81/00* (2006.01)

(52) U.S. Cl. ............... 361/679.37; 361/379.39; 361/818; 361/727; 361/725; 312/223.1

(58) Field of Classification Search ............ 361/683, 361/679.56, 685, 725, 726, 727, 753, 759, 361/816, 679.17, 679.3, 679.33, 679.34–679.41; 174/383, 382; 312/223.1, 223.2; 454/184; 369/75.11, 75.21, 76, 77.11, 77.21, 78, 79, 369/80, 81, 82; 360/97.01
See application file for complete search history.

(56) References Cited

U.S. PATENT DOCUMENTS

| | | | |
|---|---|---|---|
| 6,005,186 A | 12/1999 | Bachman | |
| 6,065,980 A | 5/2000 | Leung et al. | |
| 6,320,120 B1 | 11/2001 | Van Haaster | |
| 6,362,416 B1 | 3/2002 | Denny et al. | |
| 6,437,237 B1 | 8/2002 | Kurrer et al. | |
| 6,660,933 B2 | 12/2003 | Festag | |
| 6,794,571 B1 | 9/2004 | Barringer et al. | |
| 2007/0127202 A1* | 6/2007 | Scicluna et al. | 361/685 |
| 2008/0205026 A1* | 8/2008 | Gallarelli et al. | 361/818 |

* cited by examiner

*Primary Examiner*—Zachary M Pape
*Assistant Examiner*—Jerry Wu
(74) *Attorney, Agent, or Firm*—Yee & Associates, P.C.; Jason O. Piche (57) ABSTRACT

An improved carrier comprises a tray, an EMC component, and a bezel. The EMC component comprises a top spring set and a bottom spring set. Each spring set comprises a plurality of spring biased contacts connected by a plate and a bar so that each spring set moves in unison when depressed or released. Each tray has a first flange and a second flange and each of the flanges has a cut out portion. When an improved carrier is moved out of an array enclosure, the flanges depress the top spring of the EMC component of the carrier below. When the improved carrier is moved into the array enclosure, the flanges depress the top spring set of the carrier below until the top spring set of the carrier below is released by the cut-out portions of the flanges. When released, the top spring set of the carrier below contacts the bottom spring set of the carrier above to form a continuous EMC shield.

12 Claims, 9 Drawing Sheets

COMPACT HDD CARRIER MECHANISM FEATURING SELF ACTUATING EMC SPRINGS TO PREVENT HDD COMPONENT SHORTING

BACKGROUND OF THE INVENTION

1. Field of the Invention

The present invention relates generally to a Hard Disk Drive (HDD) Carrier mechanism and more specifically to Self Actuating Electro-Magnetic Conduction (EMC) Springs on the HDD Carrier Mechanism.

2. Description of the Related Art

The passage of electronic currents through electronic computing devices produces electromagnetic radiation. This electromagnetic radiation can interfere with transmissions on frequencies used for television, cell phones, and other communication devices. Therefore, regulatory agencies, such as the Federal Communications Commission and the International Special Committee on Radio Interference (Comite Internationale Special Pretrubation Radioelectrique), specify requirements for manufacturers of electronic computing devices to provide shielding for the electromagnetic radiation.

Requirements regarding electromagnetic interference, electrostatic discharges, and electromagnetic radiation are referred to as Electro-Magnetic Conduction (EMC) requirements. For a single electronic computing device, EMC requirements can be met by surrounding the single device with an electrically grounded shield. Surrounding a device with an electrically grounded shield is relatively simple when designing a single device; however, the task of meeting EMC requirements becomes much more difficult when dealing with multiple electronic computing devices.

A particular problem in meeting EMC requirements with multiple electronic computing devices involves design of the hard disk drives (HDD) forming part of an array and of the carriers by which the HDDs are inserted or extracted from an array housing. A carrier is a tray that holds an HDD and is used to insert the HDD into the array housing and to extract the HDD from the array housing. Currently, EMC shields are provided, in part, by the carrier. Each carrier's EMC shield must link with the EMC shields of adjacent carriers to form a continuous EMC shield in the array housing.

One type of EMC shield for carriers links with the EMC shields of adjacent carriers through spring biased contacts that engage the spring biased contacts of adjacent carriers. When spring biased contacts provide the EMC shield continuity, problems arise when removing a carrier from the array housing when the carriers above and below contain HDDs. One problem is that the stiffness of many current spring biased contact designs require a substantial force for the insertion of a carrier into the array housing. A typical spring biased contact has a profile similar to a tent, with contact between two spring biased contacts being made where their peaks meet in a point or a linear contact. When point or linear contacts are relied upon, the forces exerted by the spring biased contacts must be high enough to ensure electrical continuity. When these carriers are installed into array housings, their stiff spring biased contacts may scrape forcefully along the bottom of an HDD in an adjacent carrier, stripping off components or damaging the springs themselves.

Another problem involves electrical shorting. It is desirable to insert and extract HDDs while an array is operational. Removing an HDD while the array is operational is called hot plugging HDDs. The practice is also referred to as hot swapping (the terms are interchangeable). Hot plugging is necessary in systems where down time must be avoided and where it is necessary to replace a faulty HDD, to upgrade an HDD with a faster or larger disk, or simply to insert an HDD into an empty carrier as storage requirements increase. Hot plugging means that HDDs can be inserted and removed while the HDD array is operational. HDD carriers designed for hot plugging are referred to as hot plug carriers. When hot plugging an HDD using carriers with spring biased contacts, electrical shorting can occur.

Electrical shorting occurs when a spring biased contact on one carrier contacts another an HDD in another carrier. In particular, shorting can occur when a spring biased contact on one carrier contacts a capacitor on an HDD in an adjacent carrier. Thus, when designing a system that allows removal of an HDD from the array enclosure while other HDDs are running in the array, the problem of electrical shorting must be addressed.

To prevent damage to an HDD and to prevent electrical shorting, designers add bottom component insulators to HDDs. Bottom component insulators are essentially covers that protect susceptible components. Comprised of metal, metal and plastic, or just plastic, the bottom component insulators take up space. When designing an array, HDD thickness affects the vertical capacity of the array, and therefore, it is desirable to make the HDDs as thin as possible. One way to make the HDDs thinner is to avoid the necessity for bottom component insulators. In addition, bottom component insulators hinder air flow around and through the HDD. Bottom component insulators, even when perforated, may significantly affect the operating temperature of the HDDs, and an increase in the operating temperature of the HDD causes a degradation of long term reliability of the HDD. Thus, bottom component insulators affect design optimization of the cooling capacity of the array housing.

Bottom component insulators cannot be eliminated from an array using carriers with spring biased contacts unless a solution is found to the problems of damage to adjacent HDDs and to electrical shorting. Therefore, a need exists for spring biased contacts that will not contact HDDs in adjacent carriers. In particular, a carrier is needed that will allow insertion or extraction of a carrier without shorting of a capacitor component on an HDD in an adjacent carrier in the rack.

BRIEF SUMMARY OF THE INVENTION

An improved carrier that meets the needs identified above comprises a tray, an EMC component, and a bezel. The EMC component comprises a top spring set and a bottom spring set. Each spring set comprises a plurality of spring biased contacts connected by a plate and a bar so that each spring set moves in unison and in substantially the same plane when depressed or released. Each tray has a first flange and a second flange and each of the flanges has a cut-out portion. When an improved carrier is moved out of an array enclosure, the flanges depress the top spring of the EMC component of the carrier below. When the improved carrier is moved into the array enclosure, the flanges depress the top spring set of the carrier below until the top spring set of the carrier below is released by the cut-out portions of the flanges. When released, the top spring set of the carrier below contacts the bottom spring set of the carrier above to form a continuous EMC shield. Thus, each improved carrier in the array enclosure, when fully inserted will engage the carriers above and below to form a continuous EMS shield, but when a carrier is removed, the top spring set of the carrier below is prevented from contacting the HDD in the improved carrier above or creating an electrical short. Therefore, when using the improved carrier, HDDs do not need bottom insulators, and the HDDs can be inserted or extracted while the array is operational without damage to an operating HDD and without electrical shorting.

BRIEF DESCRIPTION OF THE SEVERAL VIEWS OF THE DRAWINGS

Embodiments of the carrier with self actuating springs are presented in the Figures described below.

DETAILED DESCRIPTION OF THE INVENTION

Figure 1:
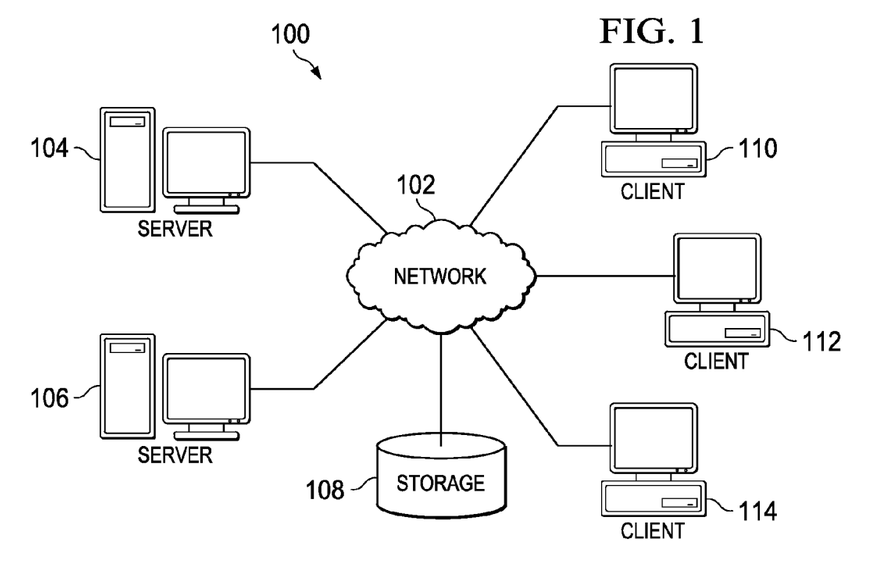
FIG. 1 depicts a pictorial representation of a network of data processing systems.

FIG. 1 depicts a pictorial representation of a network of data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables. In the depicted example, server 104 and server 106 connect to network 102 along with storage unit 108. In addition, clients 110, 112, and 114 connect to network 102. Clients 110, 112, and 114 may be, for example, personal computers or network computers. Network data processing system 100 may include additional servers, clients, and other devices not shown.

Figure 2:
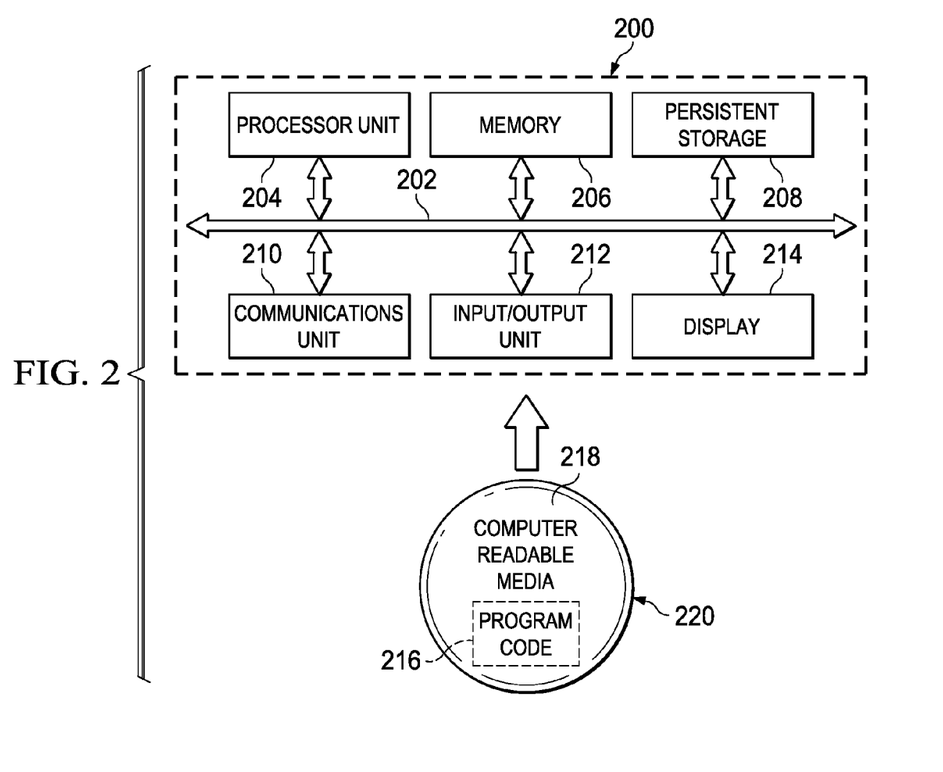
FIG. 2 a block diagram of a data processing system.

With reference now to FIG. 2, a block diagram of a data processing system is shown in which illustrative embodiments may be implemented. Data processing system 200 is an example of a computer, such as server 104 or client 110 in FIG. 1, in which computer usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214. Program code 216 is located in a functional form on computer readable media 218 that is selectively removable and may be loaded onto or transferred to data processing system 200 for execution by processor unit 204.

Figure 3:
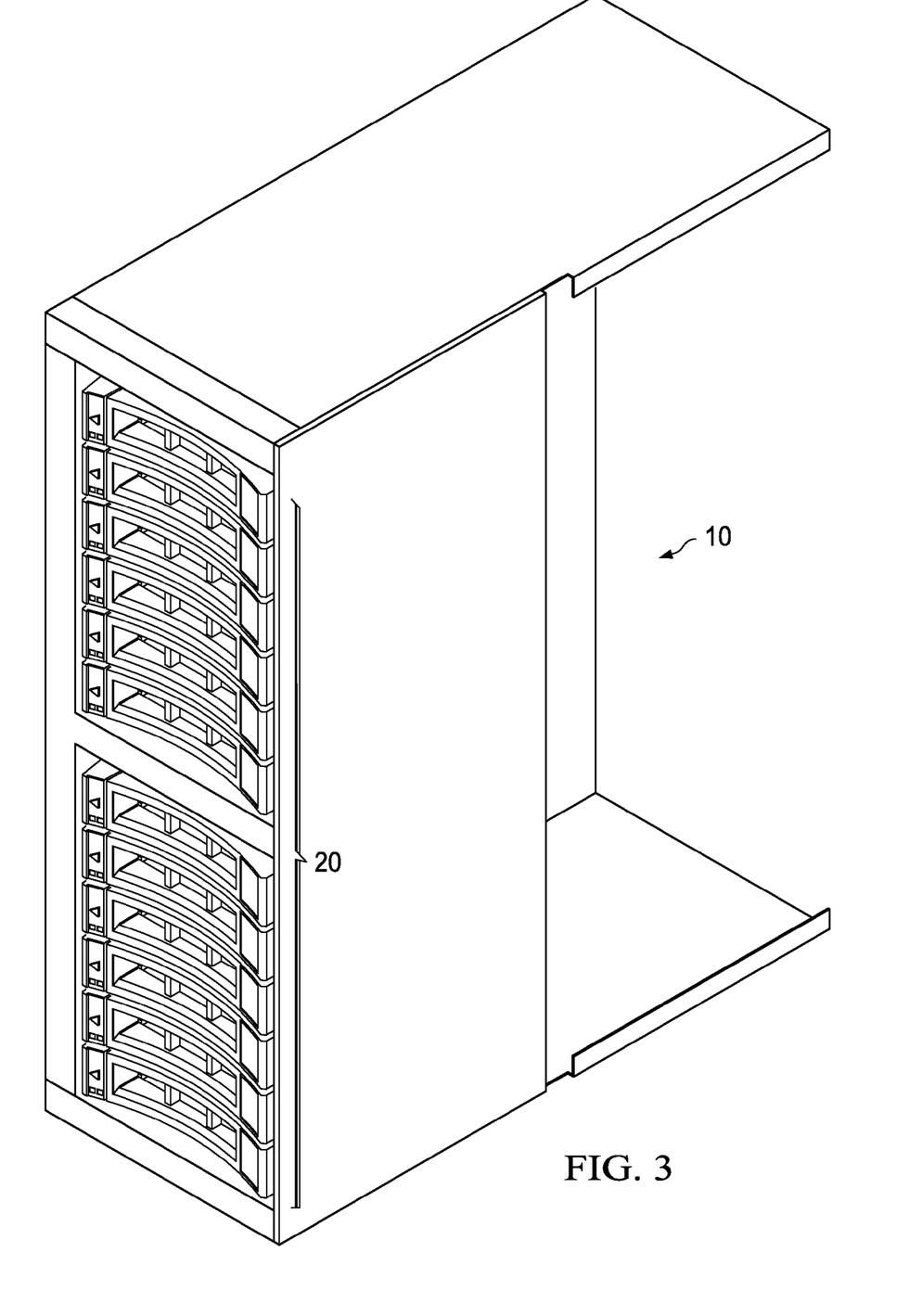
FIG. 3 depicts an exemplary array enclosure.

FIG. 3 depicts array enclosure 10 for housing array 20. Array 20 comprises a plurality of improved carriers 300 (See FIGS. 4 through 8B). Array enclosure 10 has a backplane (not shown) for engagement with backplane interface 390 of improved carriers 300 (See FIGS. 4 and 5). Array enclosure 10 may be connected to data processing system 200 and may function as computer readable medium 218.

Figure 4:
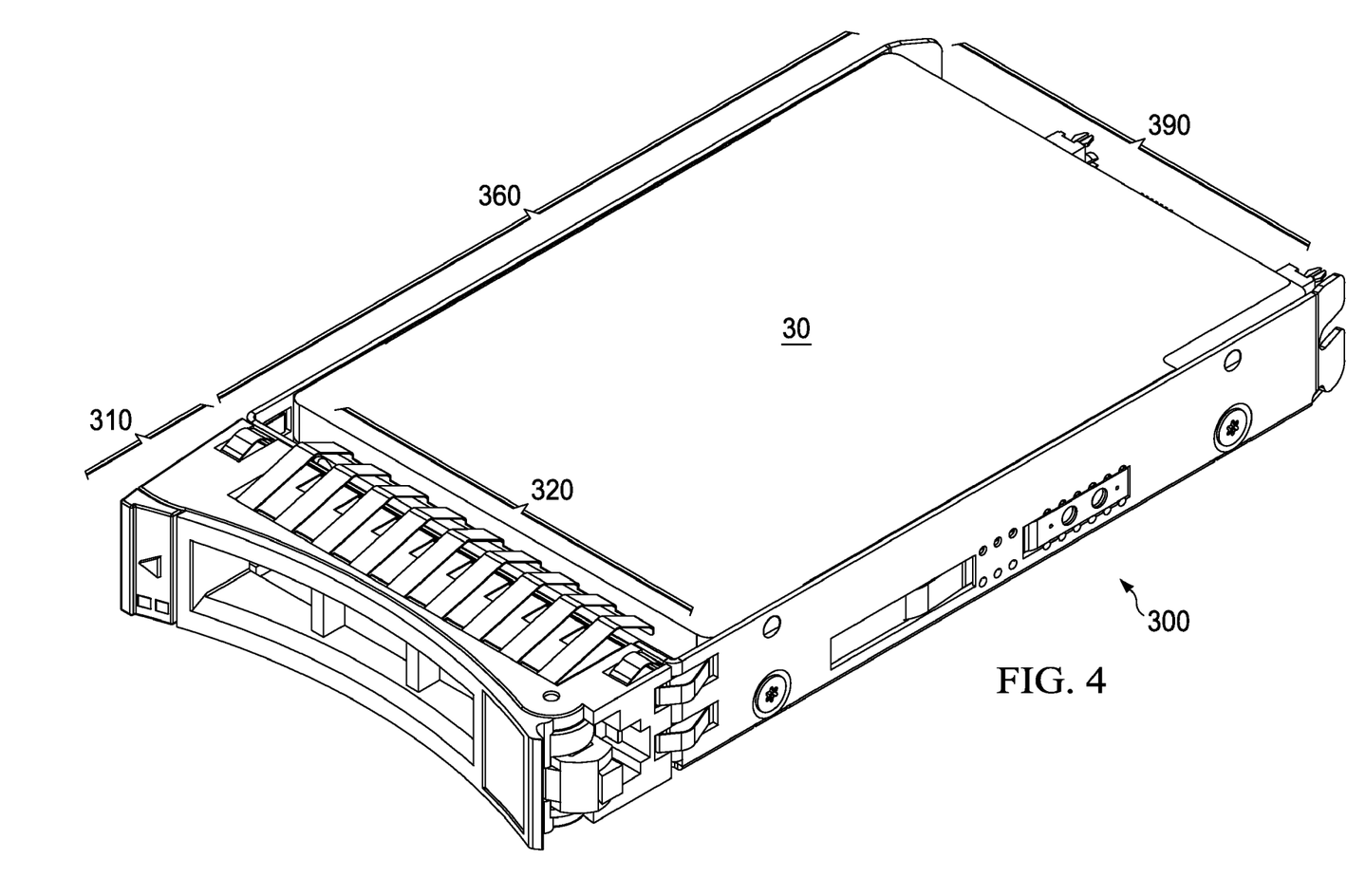
FIG. 4 depicts a top perspective view of an improved carrier containing an HDD.

FIG. 4 depicts a perspective view of improved carrier 300 containing HDD 30. Improved carrier 300 has bezel 310, EMC component 320, and tray 360. In addition, backplane interface 390 for engagement of HDD 30 to the array and an array power supply (not shown) is provided.

Figure 5:
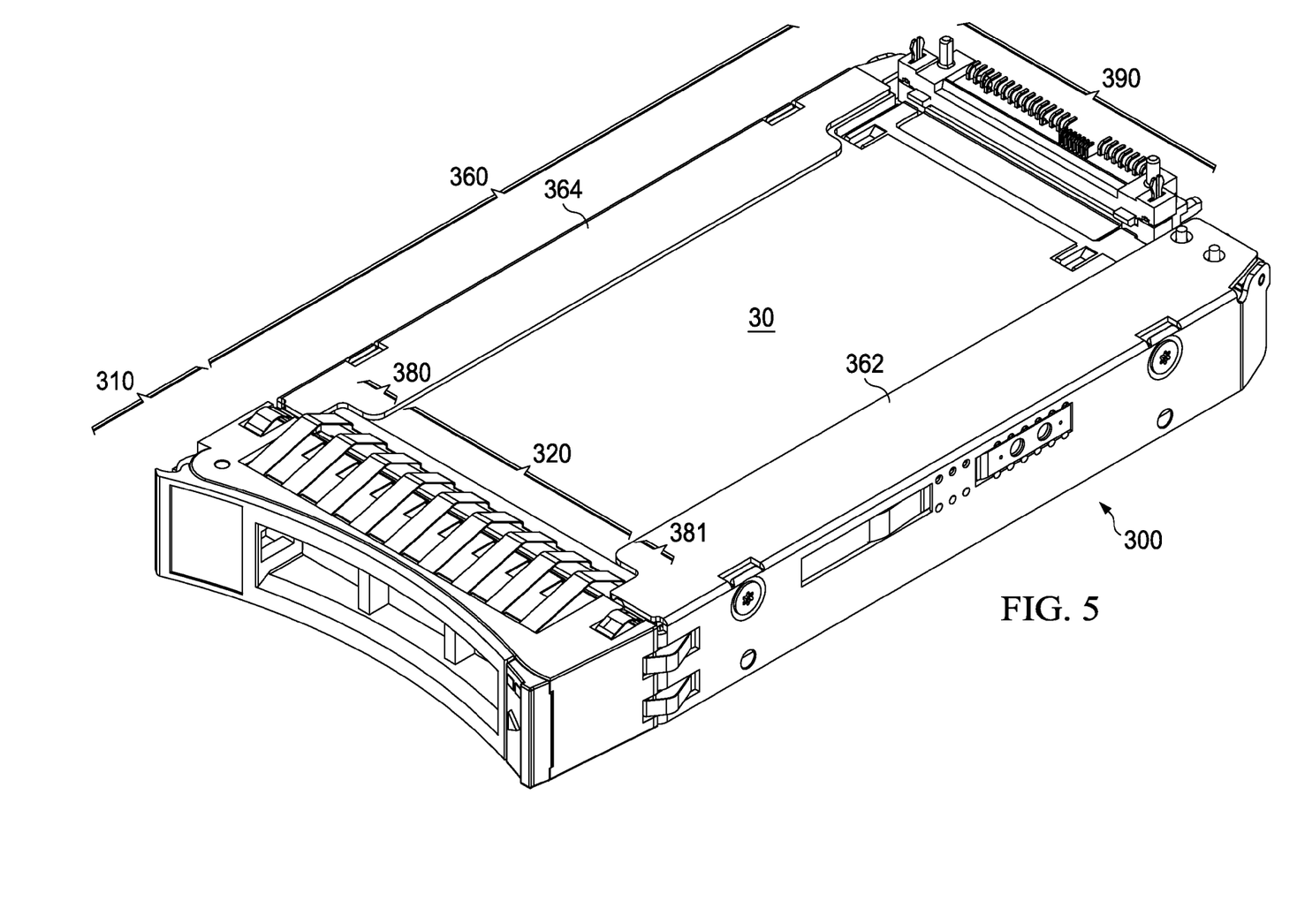
FIG. 5 is a bottom perspective view of the improved carrier.

FIG. 5 depicts a bottom perspective view of improved carrier 300. The bottom view shows that the visible portion of EMC component 320 mirrors the visible portion of EMC component 320 as seen in FIG. 4. First flange 362 and second flange 364 are affixed to tray 360. Backplane interface 390 is shown engaged with HDD 30.

Figure 6:
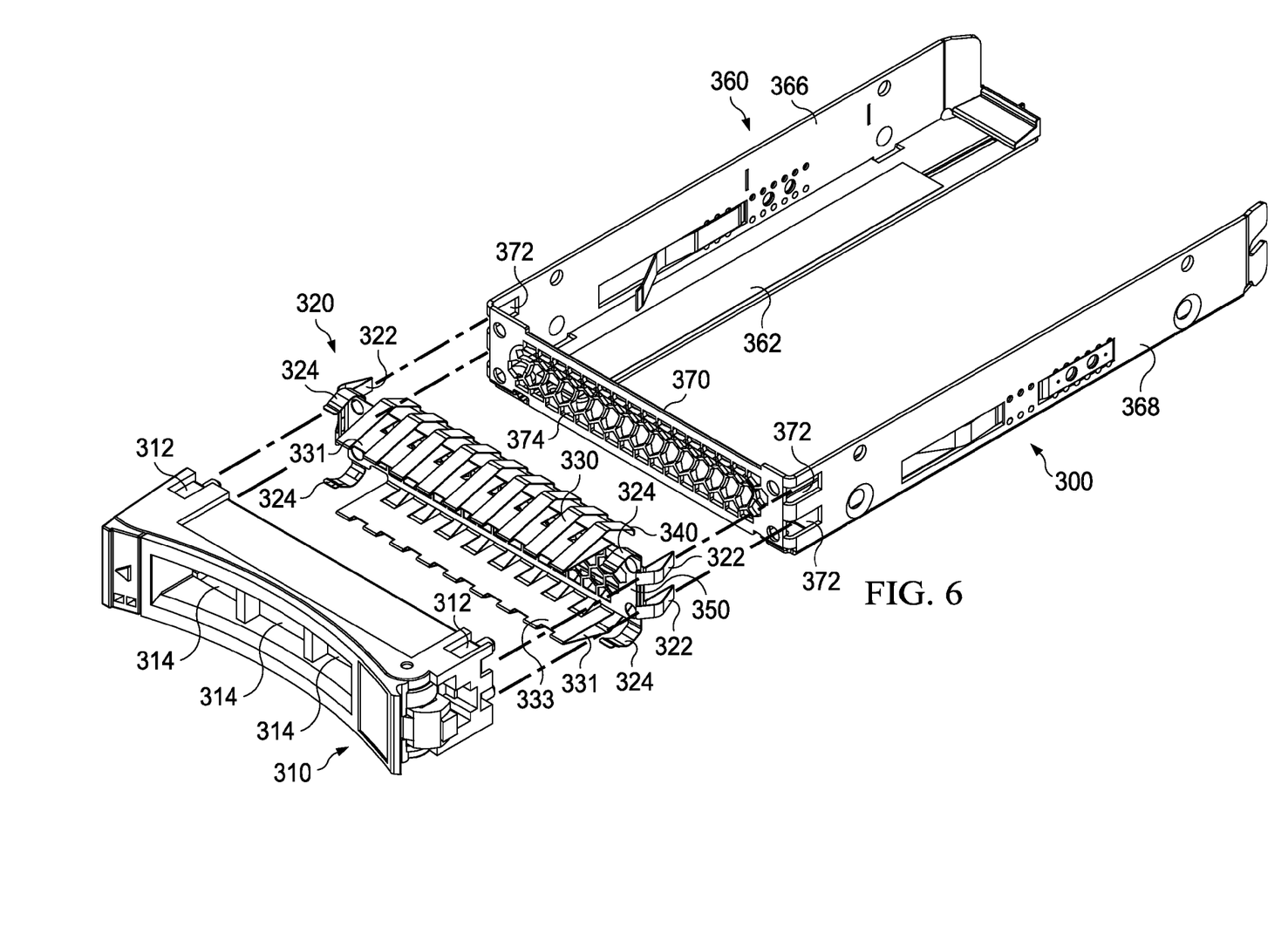
FIG. 6 is an expanded perspective view of the improved carrier.

FIG. 6 depicts an expanded perspective view of improved carrier 300 without an HDD and without backplane interface 390. Tray 360 has first side 360, second side 368 and front plate 370. Front plate 370 has first cooling structure 374. First cooling structure 374 is shown with a lattice work of hexagonal openings. Persons skilled in the art are aware that any type of opening can be used for first cooling structure 374 and that the size of the openings will be adjusted in accordance with design cooling requirements for the array. First flange 362 is visible in FIG. 6 while second flange 364 is hidden by second side 368. EMC component 320 affixes to tray 360 by engaging first clips 322 with first recesses 372 on tray 360. EMC component 360 has top spring set 330, top plate 332, bottom spring set 331, bottom plate 333, and second cooling structure 350. Top spring set 330 comprises a plurality of spring biased contacts connected to each other by top plate 332 and top bar 340. Likewise, bottoms spring set 331 comprise a plurality of spring biased contacts connected to each other by bottom plate 333 and by bottom bar 341 (not shown). Top bar 340 is best seen in the exploded view of FIG. 8B and bottom bar 341 can be seen in FIG. 8B. In addition, EMC component 320 has second clips 324 which engage bezel 310 at second recesses 312. Second cooling structure 350 is similar to first cooling structure 374. Persons skilled in the art aware that any type of opening can be used for second cooling structure 350 and that the size of the openings will be adjusted in accordance with design cooling requirements for the array. Bezel 310 has apertures 314 to allow air to pass through to first cooling structure 374 and second cooling structure 350. Persons skilled in the art are aware that array enclosure 10 is adapted for installation of cooling fans (not shown) for circulation of air.

Figure 7:
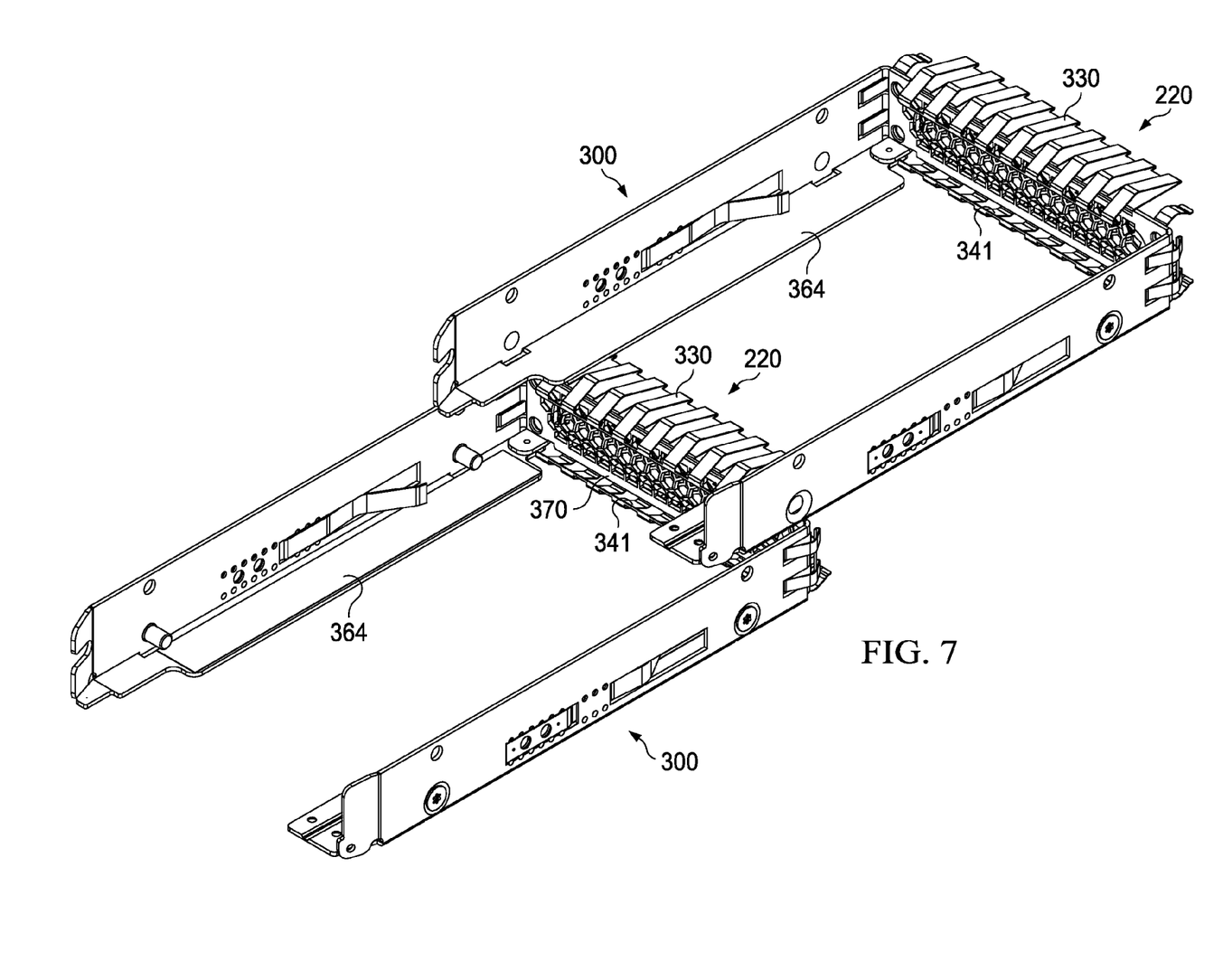
FIG. 7 depicts two improved carriers with the upper improved carrier in an open position.
Figure 8A:
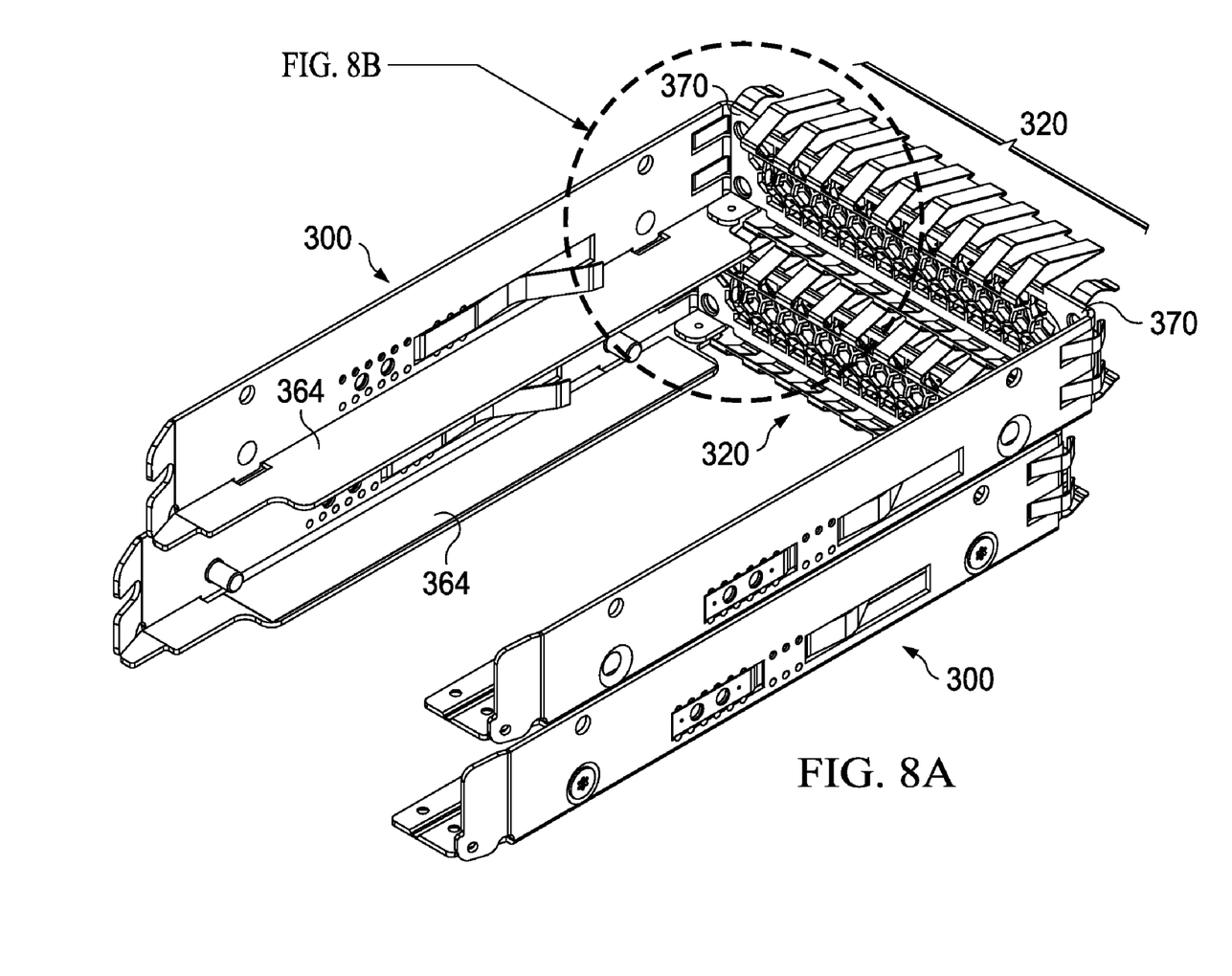
FIG. 8A depicts the two improved carriers of FIG. 7 with the lower carrier in closed position.
Figure 8B:
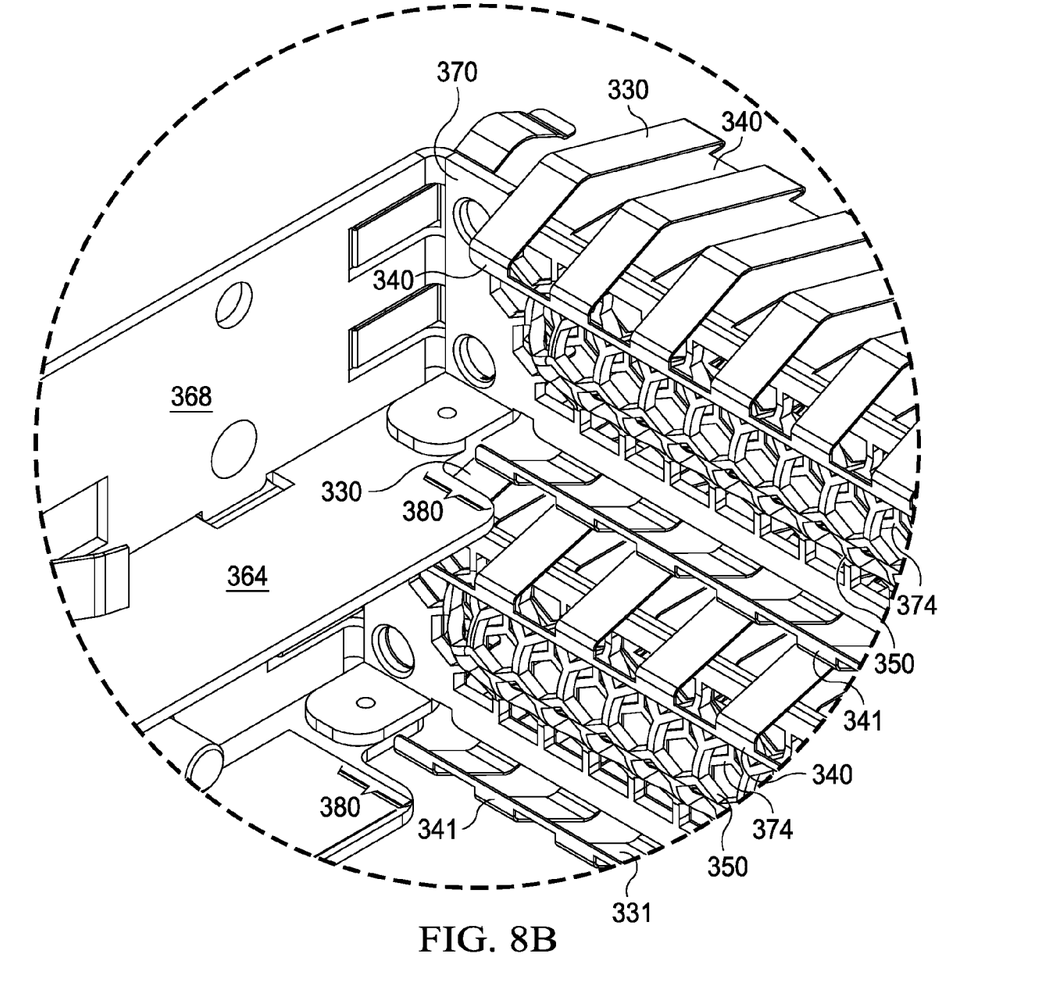
FIG. 8B is an enlarged view of a segment of the two improved carriers of FIG. 8A showing detail of the engagement of the EMC components.

In the preferred embodiment, EMC component 320 is made of unitary construction by stamping a single piece of metal such as stainless steel and then folding the stamped piece of metal into the configuration shown in FIG. 6 and in FIGS. 7 through 8B. Persons skilled in the art know that EMC component 360 can be constructed in many ways including manufacturing the spring components individually and affixing them in any manner known to persons skilled in the art. However, all embodiments of EMC component 320 are constructed so that top spring set 330 moves in unison when depressed or released and bottom spring set 331 moves in unison when depressed or released. Moreover, the individual spring biased contacts move in substantially the same plane when top spring set 330 or bottom spring set 331 moves from a first position to a second position. In the preferred embodiment, top bar 340 and top plate 332 connect the individual spring biased contacts of top spring set 330, and bottom bar 341 and bottom plate 333 connect the individual spring biased contacts of bottom spring set 331, thereby ensuring that each spring set moves substantially in unison and substantially in the same plane. The individual spring biased contacts depicted in the Figures can be described, for a top spring set, as having a general tent shape with a long rising portion and a short descending portion. The individual spring biased depicted in the Figures can be described, for a bottom spring set, as having a general tent shape with a long descending portion and a short rising portion. The terms rising or descending are relative to an orientation of a viewer. Persons skilled in the art are aware that top spring set 330 and bottom spring set 331 can take many shapes so long as they engage to form a continuous EMC shield when released by the cut out portions of the flanges of the tray above.

FIG. 7 and FIG. 8A show the relative movement of two trays 360 and EMC components 320 of two improved carriers when a top improved carrier is moved from an open position in FIG. 7 to a closed position in FIG. 8A. In order to see the interaction of the EMC components, the improved carriers are shown without HDDs inserted and without backplane interfaces. Assuming that the two improved carriers 300 are installed in an array enclosure (such as array enclosure 10 of FIG. 3), and that the array is operational, the top improved carrier will be moved to the left of the drawing to insert the HDD (not shown) into the array enclosure (not shown). As top improved carrier 300 moves to the left of the drawing, first flange 362 and second flange 364 (not shown) depress top springs 330 of the bottom improved carrier 330. Top springs 330 are depressed because first flange 362 and second flange 364 will each contact at least one of the plurality of spring biased contacts of top spring set 330 of EMC component 320 of the bottom carrier 300, and further because the individual spring biased contacts of top spring set 330 move in unison and substantially in the same plane. FIG. 8A shows the top improved carrier 300 moved fully to the left in a closed position where cut out portion 380 of second flange 364 and cut out portion 381 (can be seen in FIG. 5) of first flange 362 release top spring set 330 of the bottom improved carrier to move upward and to contact the bottom spring set of the top improved carrier 300.

FIG. 8B depicts an enlarged view of a segment of the two improved carriers of FIG. 8A showing detail of the engagement of the EMC components and a flange of the top carrier. Cut out portion 370 of second flange 364 allows top springs 330 of the bottom EMC element to release and contact bottom springs 331 of the top EMC element. FIG. 8B also shows top bar 340 and bottom bar 341, and second cooling structure 350 in greater detail. First cooling structure 374 can be seen behind second cooling structure 350.

Figure 9:
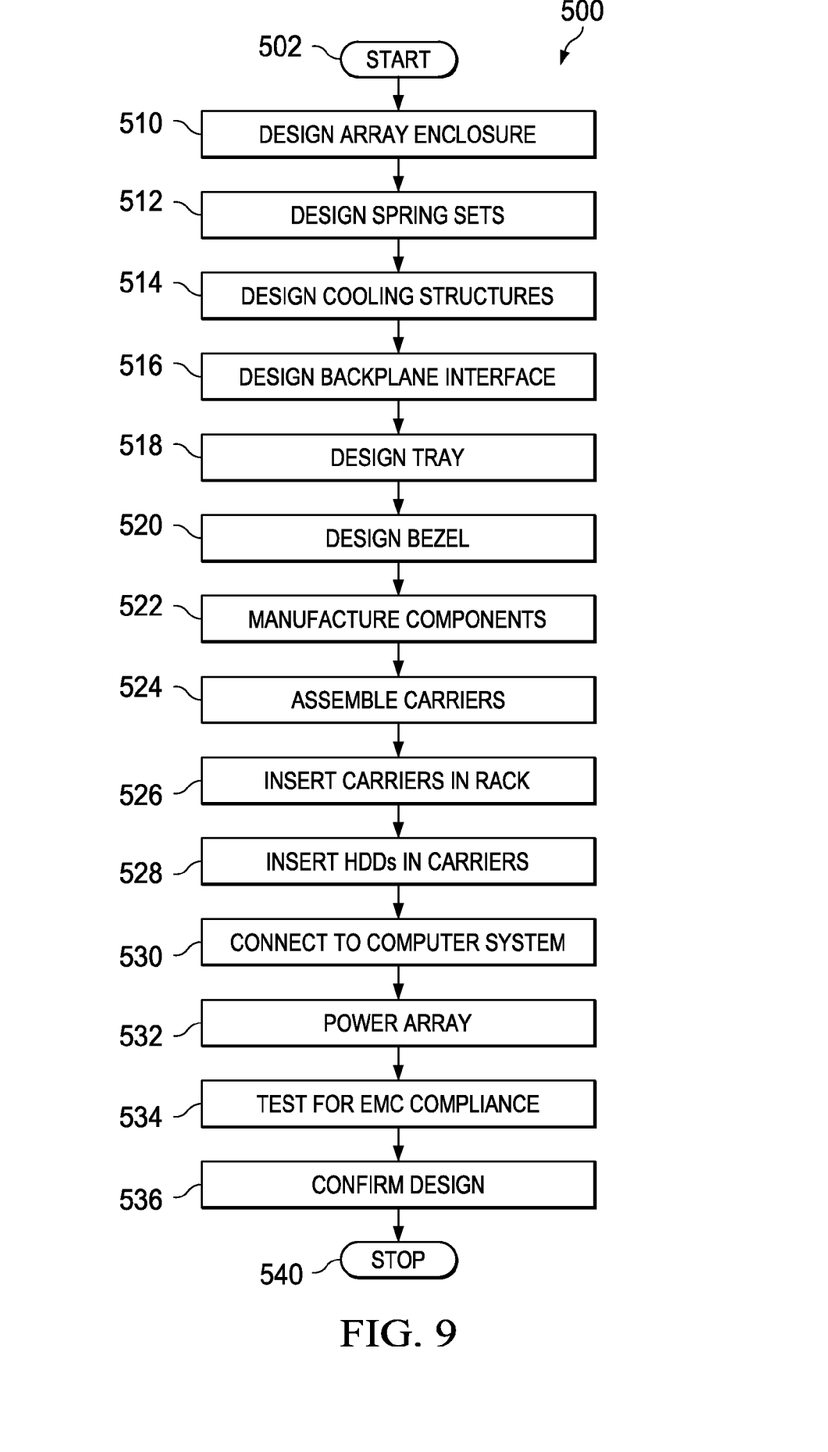
FIG. 9 is a flow chart of the method of making an array enclosure with improved carriers.

FIG. 9 is a flow chart of the method of making an array enclosure for hot plugging HDD's using a tray with flanges having cut outs to depress and release spring sets that connect to form an EMC shield. The method can be adapted for implementation by a computerized system that will design, manufacture, assemble, and test the array enclosure in accordance with the method described. For computer implantation, a general computer system as depicted in FIG. 1 and FIG. 2 can be used. First, an array enclosure is designed to meet operational requirements. Design of the array enclosure includes a power supply and a backplane to connect with the HDDs in the array, with a power supply and with other necessary components. Next, spring sets are designed to form the EMC component (512). Preferably, the spring set is designed to be manufactured from a single sheet of conductive material such as stainless steel. When a metal is used as the conductive material it is further preferable to stamp the single piece of metal and then fold it into the desired shape. When stamping is used, the cooling structure may be incorporated into the design or it may be installed as a separate piece to be placed into a cut out portion of the stamped metal sheet. Cooling structures are designed including a cooling structure for the spring sets, the cooling structure for the tray front plate, and the apertures for the bezel (514). A backplane interface is designed for connecting the HDDs to the backplane of the array enclosure (516). The tray to hold the HDD is designed including connectivity to the EMC structure and to the backplane interface (518). The bezel and bezel connectivity to the EMC structure is designed (520). The components are manufactured (522), the trays assembled (524), and the carriers assembled (524). The carriers are inserted into the array enclosure (526). HDDs without bottom insulators are inserted into the carriers (528). The array is connected to a computer system (530), powered (532), and tested for EMC compliance (534). The design is confirmed (536).

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of providing electromagnetic conduction resistance for insertion, extraction and operation of a plurality of high-density disks in an array enclosure, the high-density disks having no bottom insulators, comprising:
   responsive to a release of a second spring set in a second carrier from a contact with an underside of a flange of a first carrier by a cut-out portion of the flange in the first carrier, engaging a first spring set from the first carrier with the second spring set of the second carrier to form a continuous electromagnetic conduction shield.

2. A carrier for providing electromagnetic conduction resistance for insertion, extraction and operation of a high density disk in an array enclosure, the high density disk having no bottom insulator, comprising:
   a first tray having a first flange connected to a first side, a second flange connected to a second side, a front plate connected to the first side and the second side, the tray adapted to receive a high density disk and for sliding engagement with the array enclosure;
   an electromagnetic conduction component having a top spring set and a bottom spring set removably attached to the front plate;
   wherein the first flange and the second flange each have a cut out portion configured to permit engagement of a second spring set of a second tray with the first spring set of the first tray to form a continuous EMC shield; and
   wherein the first flange and the second flange depress the second spring set when the second spring set of the second tray is moved away from the cut out portions of the first flange and the second flange.

3. The carrier of claim 2 further comprising:
   a bezel removably attached to the electromagnetic conduction component.

4. The carrier of claim 3 further comprising:
   a first cooling structure in the front plate.

5. The carrier of claim 4 further comprising:
   a second cooling structure in the electromagnetic conduction component.

6. A method of making a carrier providing electromagnetic conduction resistance for insertion, extraction and operation of a high-density disk in a rack adapted to provide an array of high-density disks, each high density disk having no bottom insulator, comprising:

designing an array enclosure to meet a plurality of operational requirements;

designing an electromagnetic conduction shield component using at least one spring set;

designing a backplane interface; and designing a tray configured to connect to the electromagnetic shield and having at least one flange with at least one cut-out configured to depress and release a corresponding spring set of a corresponding electromagnetic shield.

7. The method of claim 6 further comprising:

designing a bezel; and designing a cooling structure for the tray front plate, the electromagnetic shield component, and the bezel.

8. The method of claim 7 further comprising:

manufacturing the tray, the electromagnetic conduction shield component, the backplane interface, the cooling structure and the bezel;

assembling at a carrier from the tray, the electromagnetic conduction shield component, the backplane interface, and the bezel;

inserting the carrier into the array enclosure powering the array;

testing the array for an electromagnetic conduction compliance; and confirming the design.

9. The method of claim 7 further comprising:

wherein the designing steps are performed by a computerized system in response to a plurality of computer program instructions.

10. The method of claim 8 further comprising:

wherein the manufacturing, assembling, and testing steps are performed by a computerized system in response to a plurality of computer program instructions.

11. The method of claim 1, further comprising:

responsive to a movement of the second carrier bringing the second spring set in contact with an edge of the cut-out portion and a further movement bringing the second spring set under and against the underside of the flange of the first carrier, depressing the second spring set to disengage the second spring set from the first spring set, wherein each of the first spring set and the second spring set have a plurality of long portions and a plurality of short portions in each spring set that maintain contact between the first spring set and the second spring set during an initial movement of the second carrier and until the edge of the cut-out portion presses on a short portion of the second spring set to effect a disengagement of the first spring set and the second spring set.

12. The carrier of claim 2 further comprising:

wherein each of the first spring set and the second spring set have a plurality of long portions and a plurality of short portions that maintain contact between the first spring set and the second spring set during an initial movement of the second carrier and until the edge of the cut-out portion presses on a short portion of the second spring set to effect a disengagement of the first spring set and the second spring set.

\* \* \* \* \*